United States Patent [19]

Everts

[11] Patent Number: 5,443,034

[45] Date of Patent: Aug. 22, 1995

[54] METHOD AND APPARATUS FOR INCREASING SILICON INGOT GROWTH RATE

[75] Inventor: Scott W. Everts, Torrance, Calif.

[73] Assignee: Solec International, Inc., Hawthorne, Calif.

[21] Appl. No.: 292,087

[22] Filed: Aug. 17, 1994

[51] Int. Cl.6 ............................................. C30B 35/00
[52] U.S. Cl. ..................................... 117/208; 117/13; 117/200
[58] Field of Search ................. 117/13, 200, 208, 210, 117/216, 217

[56] References Cited

U.S. PATENT DOCUMENTS

| | | | |
|---|---|---|---|
| 4,330,361 | 5/1982 | Kuhn-Kuhnenfeld et al. | 117/217 |
| 4,330,362 | 5/1982 | Zulehner | 117/13 |
| 4,497,777 | 2/1985 | Kojima | 117/208 |
| 5,264,189 | 11/1993 | Yamashita et al. | 117/217 |
| 5,316,742 | 5/1994 | Tomioka et al. | 117/217 |

Primary Examiner—R. Bruce Breneman
Assistant Examiner—FeLisa Garrett
Attorney, Agent, or Firm—Blakely, Sokoloff, Taylor & Zafman

[57] ABSTRACT

A CZ crystal growing furnace which has a radiative heat shield that can be raised and lowered above a crucible. The heat shield assembly includes an upper heat shield that is mounted to a furnace cover directly above the crucible. Coupled to the upper shield is a lower heat shield which can move between a first raised position and a second lower position. Attached to the seed holder of the furnace is a bar which maintains the lower heat shield in the first raised position, so that the crucible can be filled with raw silicon. After the silicon is melted, the heat shield is lowered to the second position and the bar is lifted and removed from the furnace. The lower heat shield has an outer ring which cooperates with an inner ring of the upper heat shield to suspend the lower shield in the second position. The heat shield also has a tapered wall which defines an opening that allows an ingot to be pulled from the molten silicon.

6 Claims, 1 Drawing Sheet

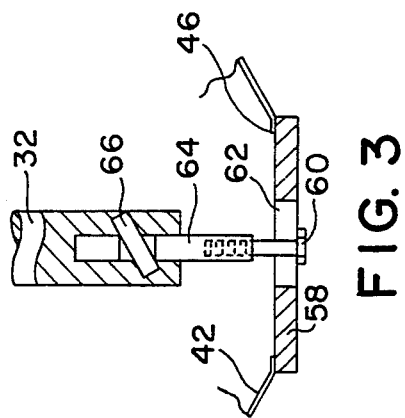
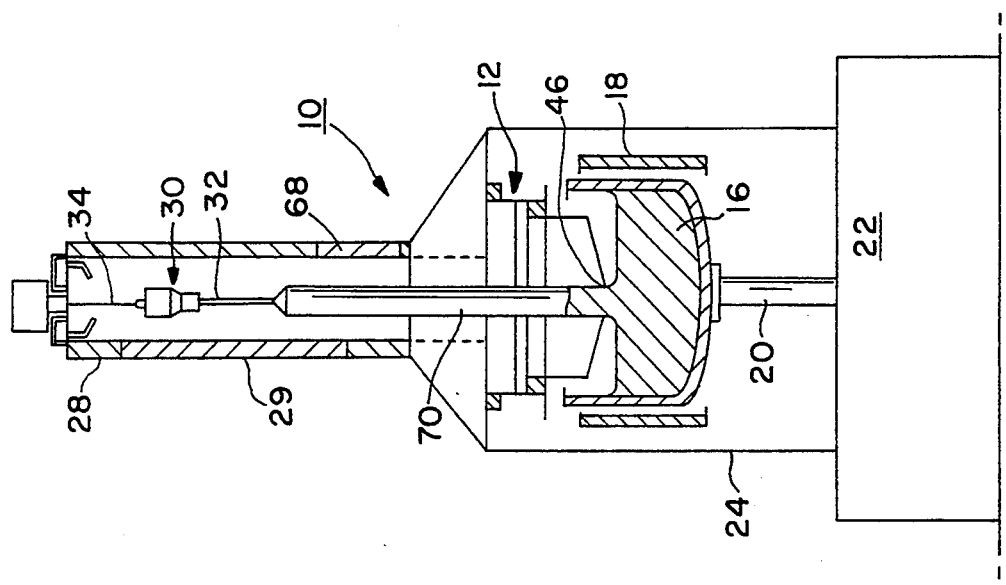
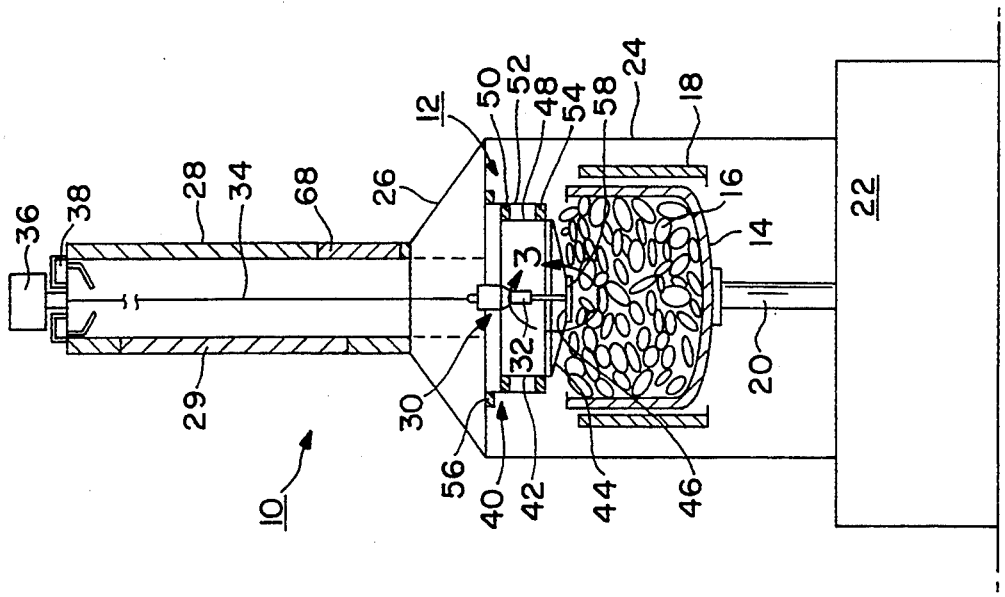

METHOD AND APPARATUS FOR INCREASING SILICON INGOT GROWTH RATE

BACKGROUND OF THE INVENTION

1. Field of the Invention

The present invention relates to a heat shield for a Czochralski type crystal growing furnace.

2. Description of Related Art

Photovoltaic cells may be constructed from silicon wafers that are cut from a single crystal ingot. Silicon ingots are typically created using one of two processes commonly referred to as the Czochralski (CZ) method and the float zone (FZ) method. In the Czochralski method a seed is placed in a crucible of melted raw silicon and then pulled away from the crucible. The surface tension of the silicon pulls molten material out of the crucible, wherein the silicon cools and solidifies in an area commonly known as the melt interface. The pull rate of the seed and the temperature of the molten silicon are closely controlled by a computer to insure that the ingot grows as a single crystal. Conventional crystal growing furnaces also provide gaseous jet streams that cool the ingot, and prevent oxidation and the diffusion of impurities into the silicon.

The production rate of silicon ingots is greatly dependent upon the pull rate of the furnace. The faster the pull rate, the greater the production rate. The pull rate is limited by the heat transfer rate of the ingot as the silicon is pulled out of the crucible. A significant amount of heat can be transferred to the ingot from the molten silicon through radiative heat transfer. To increase both the cooling rate and the pull rate of the ingot, it is desirable to provide a heat shield which greatly reduces the amount of radiative heat transfer from the molten silicon to the ingot. Such a shield must be capable of withstanding the extreme temperatures of molten silicon and not contaminate the ingot.

U.S. Pat. No. 4,330,362 issued to Zulehner, discloses a CZ crystal growing furnace which contains a radiation heat shield located directly above the molten silicon. The Zulehner heat shield is attached to an outer shield member that extends along the outer wall of the crucible. The silicon is typically replenished by raw silicon pieces that are fed to the crucible through a chute. Although effective in shielding the ingot, the Zulehner system requires a continuous feeding of silicon pieces through a chute system.

Most conventional CZ furnaces begin with a pile of raw silicon pieces that are then melted and pulled until an ingot is formed. The crucible is then refilled with raw silicon and the process is repeated. The pile of raw silicon is typically much taller then the molten silicon bath. The Zulehner system would therefore be impractical for conventional CZ furnaces, because the heat shield would not accommodate the change in height between the pile of raw silicon and the molten bath.

U.S. Pat. No. 4,330,361 issued Kuhn-Kuhnenfeld et al, discloses a CZ furnace which has a radiation screen that can be lowered and pivoted adjacent to the molten silicon after the raw silicon pieces have been melted. The Kuhn-Kuhnenfeld system requires more furnace space than a conventional CZ furnace because of the additional area required to pivot the heat shield. It would be desirable to have a radiative heat shield that was compact, simple to use and would compensate for the differences in height between the raw silicon and the molten silicon bath.

SUMMARY OF THE INVENTION

The present invention is a CZ crystal growing furnace which has a radiative heat shield that can be raised and lowered above a crucible. The heat shield assembly includes an upper heat shield that is mounted to a furnace cover directly above the crucible. Coupled to the upper shield is a lower heat shield which can move between a first raised position and a second lower position. Attached to the seed holder of the furnace is a bar which maintains the lower heat shield in the first raised position, so that the crucible can be filled with raw silicon. After the silicon is melted, the heat shield is lowered to the second position and the bar is lifted and removed from the furnace. The lower heat shield has an outer ring which cooperates with an inner ring of the upper heat shield to suspend the lower shield in the second position. The heat shield also has a tapered wall which defines an opening that allows an ingot to be pulled from the molten silicon.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a cross-sectional view of a CZ crystal growing furnace having a heat shield assembly of the present invention in a first raised position above a crucible containing raw silicon pieces;

FIG. 2 is a side view similar to FIG. 1, showing the silicon melted and the heat shield lowered into a second position;

FIG. 3 is an enlarged side view showing a bar suspending a lower heat shield.

DETAILED DESCRIPTION OF THE INVENTION

Referring to the drawings more particularly by reference numbers, FIG. 1 shows a Czochralski crystal growing furnace 10 with a heat shield assembly 12 of the present invention. The furnace 10 includes a crucible 14 adapted to hold molten silicon. In the preferred embodiment, the crucible 14 is constructed to have a outer layer of graphite and an inner layer of fused silica. The crucible 14 is initially filled with pieces of raw pure silicon 16. The raw silicon 16 is melted by a heater 18 located adjacent to the crucible 14. The crucible 14 is typically coupled by a shaft 20 to a motor 22 which rotates the silicon to provide a more uniform temperature distribution throughout the molten bath.

The crucible 14 is encapsulated by a furnace tank 24, a furnace cover 26 and a pull chamber 28. The pull chamber 28 has a door 29 that allows the ingot to be removed from the furnace. Extending through the pull chamber 28 is a seed feeder assembly 30 which has a holder 32 that is suspended from a cable 34. The cable 34 is connected to a pulley assembly 36 which can move the seed holder 32 relative to the crucible 14. The furnace 10 also has a cooling system 38 which creates a gaseous stream in the pull chamber 28. The gas stream cools the ingot and prevents contamination of the silicon. In the preferred embodiment, the cooling stream provides a stream of argon gas at 50 liters per system 38 at a pressure of approximately 20 torrs.

The heat shield assembly 12 includes an upper heat shield 40 which is mounted to the furnace cover 26. Coupled to the upper heat shield 40 is a lower heat shield 42 which can move between a first raised position and a second lower position. The lower heat shield 42 has a tapered wall 44 which defines an opening 46. The opening 46 allows the feeder assembly 30 to place an ingot seed into the crucible 14. The tapered wall extends from an outer wall 48 that is mounted to an outer ring 50 of the lower shield 42.

The heat shield is preferably constructed from molybdenum. Molybdenum has a melting temperature of 2600° C., which is above the typical furnace operating temperature of 1900° C. Additionally, molybdenum will not produce gases or other impurities that may contaminate the silicon. The upper heat shield 40 is preferably constructed from three separate pieces which include an outer wall member 52 that is attached to an inner ring 54 and a mounting ring 56 that is mounted to the cover 26.

As shown in FIG. 3, the lower heat shield 42 is suspended in the first position by a bar 58. The bar 58 is attached to the seed holder 32 by a bolt 60 that extends through a slot 62 in the bar and is screwed into a coupling member 64. The coupling member 64 is attached to the seed holder 32 by a pin 66 that extends through a notch in the member 64. When the bar 58 is lowered by the pulley 36, the lower shield 42 slides down into the second position. The bar 58 is further lowered away from the shield 42 so that the bar can be rotated and pulled through the opening 46. The bolt 60 is typically attached at a location that is off-center from the center of gravity of the bar 58, so that the 58 bar will rotate from the force of gravity when separated from the lower shield 42. The bar 58 is preferably constructed to be only slightly longer than the diameter of the opening 46 so that the bar can be pulled therethrough. The pulling chamber 28 contains a second door 68 that allows the bar 58 to be removed from the holder and a seed inserted therein. The door 68 can also be used to move the cable 34 and rotate the bar 58.

In operation, the lower heat shield 42 is supported in the first position as shown in FIG. 1. The crucible 14 is filled with raw pure silicon pieces which are then melted into a molten bath. The feeder assembly 30 then lowers the bar 58 so that the lower shield 42 slides into the second position shown in FIG. 2. The bar 58 is then rotated, lifted and detached from the seed holder 32. An ingot seed is then attached to the seed holder 32 and placed into the molten silicon. The seed is pulled out of the silicon wherein there is formed an ingot 70.

The heat shield 42 reduces the amount of heat transfer from the molten silicon to the ingot 70 thus greatly increasing the cooling rate of the ingot. The cooling rate is further reduced by the tapered wall which funnels the cooling gas to the melt interface of the ingot 70. The increased cooling rate allows the ingot to be pulled at a greater pull rate. It has been found that the pull rate of the ingot using the heat shield of the present invention can be pulled up to twice as fast as the pull rate used in conventional CZ furnaces. Faster pull rates increase the production rate of the ingot and ultimately reduce the cost of the silicon wafers that are cut from the ingot.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A heat shield assembly for a crystal growing furnace which has a crucible, a furnace cover and a feeder assembly located above the crucible, comprising:
    an upper heat shield coupled to the furnace cover;
    a lower heat shield coupled to said upper heat shield and located above the crucible; and,
    movement means for supporting and moving said lower heat shield between a first position and a second position above the crucible, such that said lower heat shield is located above the crucible in both the first and second positions.

2. The assembly as recited in claim 1, wherein said lower heat shield includes an outer ring which cooperates with an inner ring of said upper heat shield to support said lower heat shield in the second position.

3. The assembly as recited in claim 1, wherein said lower heat shield includes a tapered wall which extends from a side wall and defines an opening that allows the feeder assembly to extend therethrough.

4. The assembly as recited in claim 3, wherein said movement means include a plate which is coupled to the feeder assembly and engages said tapered wall to support said lower heat shield.

5. The assembly as recited in claim 4, wherein said lower heat shield includes an outer ring which cooperates with an inner ring of said upper heat shield to support said lower heat shield in the second position.

6. The assembly as recited in claim 5, wherein said upper and lower heat shields are constructed from molybdenum.

* * * * *